(12) United States Patent
Sakamoto (10) Patent No.: US 7,519,932 B2
(45) Date of Patent: Apr. 14, 2009

(54) SYSTEM AND METHOD FOR ANALYZING CROSSTALK OCCURRING IN A SEMICONDUCTOR INTEGRATED CIRCUIT

(75) Inventor: Toshiyuki Sakamoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/393,074

(22) Filed: Mar. 30, 2006

(65) Prior Publication Data

US 2006/0230374 A1    Oct. 12, 2006

(30) Foreign Application Priority Data

Apr. 7, 2005    (JP)    ............................ P2005-111031

(51) Int. Cl.
*G06F 9/45* (2006.01)
*G06F 17/50* (2006.01)

(52) U.S. Cl. .................................... 716/6; 716/4; 716/5
(58) Field of Classification Search ...................... 716/2, 716/4–6, 12
See application file for complete search history.

(56) References Cited

U.S. PATENT DOCUMENTS

| | | | |
|---|---|---|---|
| 6,405,350 B1 * | 6/2002 | Tawada | 716/5 |
| 6,510,540 B1 * | 1/2003 | Krauter et al. | 716/4 |
| 6,594,805 B1 * | 7/2003 | Tetelbaum et al. | 716/5 |
| 6,615,395 B1 * | 9/2003 | Hathaway et al. | 716/6 |
| 7,062,737 B2 * | 6/2006 | Tetelbaum et al. | 716/6 |
| 7,178,121 B2 * | 2/2007 | Tetelbaum | 716/6 |
| 7,216,316 B1 * | 5/2007 | Sutherland et al. | 716/6 |
| 2003/0229873 A1 * | 12/2003 | Casavant | 716/6 |
| 2006/0080627 A1 * | 4/2006 | Murgai et al. | 716/6 |

OTHER PUBLICATIONS

Rajesh Kumar, Proceeding 40th ACM/IEEE Design Automation Conference, "Interconnecti and Noise Immunity Design For Pentium 4 Processor", pp. 938-943, 2003.*

Rajesh Kumar, Proceedings 40th ACM/IEEE Design Automation Conference, "Interconnect and Noise Immunity Design For the Pentium 4 Processor," pp. 938-943, 2003.

* cited by examiner

*Primary Examiner*—Paul Dinh
*Assistant Examiner*—Nha T Nguyen
(74) *Attorney, Agent, or Firm*—DLA Piper LLP (US)

(57) ABSTRACT

A system for analyzing crosstalk occurring in a semiconductor integrated circuit, includes calculating timing windows of first and second wires under a first and second analysis conditions, a sequence determination module determining whether a sequence of the timing windows of the first and second wires interchanges, and an analysis module analyzes crosstalk occurring between the first and second wires when an interchange of the sequence occurs.

6 Claims, 9 Drawing Sheets

SYSTEM AND METHOD FOR ANALYZING CROSSTALK OCCURRING IN A SEMICONDUCTOR INTEGRATED CIRCUIT

CROSS REFERENCE TO RELATED APPLICATIONS AND INCORPORATION BY REFERENCE

This application is based upon and claims the benefit of priority from prior Japanese Patent Application P2005-111031 filed on Apr. 7, 2005; the entire contents of which are incorporated by reference herein.

BACKGROUND OF THE INVENTION

1. Field of the Invention

The present invention relates to a technology for analyzing a semiconductor integrated circuit, and particularly relates to a system and a method for analyzing crosstalk occurring in a semiconductor integrated circuit.

2. Description of the Related Art

As miniaturization of semiconductor integrated circuits progresses, crosstalk attributable to coupling capacitance between the wires has a significant influence on characteristics of the semiconductor integrated circuit. Specifically, malfunction of the semiconductor integrated circuit caused by crosstalk glitch, crosstalk delay and the like is a problem.

"Crosstalk glitch" is the phenomenon when a signal transition of a wire causes a pulse in an adjacent wire. "Signal transition" is the change of the signal level of the wire from a high level to a low level or the change from a low level to a high level. The wire affected by the crosstalk will be hereinafter referred to as a "victim". The wire which causes the problem will be hereinafter referred to as an "aggressor". "Crosstalk delay" is the phenomenon when the delay time of the signal level of the victim changes due to influence from the transition of the signal level of the aggressor when the signal levels of the aggressor and the victim change at the same time.

To analyze the crosstalk influence on characteristics of the semiconductor integrated circuit based on the design information of the semiconductor integrated circuit, a determination is made as to whether or not there is an overlapping of the timing windows between the wires, which are capacitance coupled with each other. "Timing window" refers to a period where the possibility of the signal level of wire transitioning exists. In other words, the timing window is defined as a time from the earliest time to the latest time when the signal level changes. In the case where two or more aggressors affect a single victim, the influence of the crosstalk caused by the crosstalk glitch may be largest when there is an overlapping of the timing windows of the aggressors, and the influence of the crosstalk caused by the crosstalk delay may be largest when there is an overlapping of the timing windows of the aggressors and the victim. In such case, it is necessary to investigate the crosstalk influence on characteristics of the semiconductor integrated circuit. In other words, by calculating the variable value of the delay time of the signal level caused by crosstalk delay (hereafter referred to as "crosstalk delay value") or the size of the pulse that occurs due to crosstalk glitch, the crosstalk influence on characteristics of the semiconductor integrated circuit is analyzed.

The crosstalk delay value is a difference in delay time of the signal level between when crosstalk delay occurs and when crosstalk delay does not occur. For example, the crosstalk delay value is the difference between the delay time of the signal level of the victim when the signal level of the victim and aggressor change at the same time and the delay time of the victim when the signal level of the victim and aggressor do not change at the same time.

In the case of crosstalk glitch, the signal level of the victim is a constant value and it is necessary to consider the overlapping of the timing windows of a plurality of aggressors affecting the same victim. In the case of crosstalk delay, it is necessary to consider the timing window overlapping of the victim and a plurality of aggressors.

In general, in order to investigate whether or not there is the overlapping of the timing windows, the delay time of the signal level is calculated by analysis conditions. Signal delays in transistors, wires, and the like change according to the influence of temperature, power supply voltage, process dispersion, and the like.

As a result, for example, the timing window is calculated under condition in which the signal delay is a minimum and under condition in which the signal delay is a maximum, respectively. However, the timing window changes under the influence of temperature, power supply voltage, process dispersion, and the like. Therefore, it is not guaranteed that there is no overlapping of the timing windows under an analysis condition that is between the conditions that have been analyzed, even when the analyzed conditions indicate there is no overlapping of the timing windows.

To solve the above problem, there is a method to calculate the overlapping of the timing windows by changing, little by little, the analysis conditions of the temperature, power supply voltage, process dispersion and operating frequency of the semiconductor integrated circuit. By changing the analysis conditions, little by little, the possibility of overlooking the overlapping of timing windows is reduced. However, because it is necessary to investigate the timing windows after setting many analysis conditions, the time required to analyze the crosstalk is increased.

SUMMARY OF THE INVENTION

An aspect of the present invention inheres in a system for analyzing crosstalk occurring in a semiconductor integrated circuit. The system includes a calculator configured to calculate timing windows of first and second wires, which are routed in the semiconductor integrated circuit, under a first analysis condition and calculate timing windows of the first and second wires under a second analysis condition; a sequence determination module configured to determine whether a sequence of the timing windows interchanges; and an analysis module configured to analyze crosstalk occurring between the first and second wires when the interchange of the sequence occurs.

Another aspect of the present invention inheres in a system for analyzing crosstalk occurring in a semiconductor integrated circuit. The system includes a calculator configured to calculate timing windows of a plurality of wires routed in the integrated semiconductor circuit under a first analysis condition and a second analysis condition, respectively; a setting module configured to set an overlapping conditional expression group of variables as a coefficient, which determines a medium analysis condition between the first analysis condition and the second analysis condition, and an overlap time, at which the timing windows of the plurality of wires overlap each other; an overlapping determination module configured to determine whether there is a solution for the coefficient and the overlap time, which satisfies the overlapping conditional expression group; and an analysis module configured to analyze crosstalk occurring between the wires, when there is the solution.

Still another aspect of the present invention inheres in a computer implemented method for analyzing crosstalk occurring in a semiconductor integrated circuit. The method includes calculating timing windows of first and second wires, which are routed in the semiconductor integrated circuit, under a first analysis condition and calculate timing windows of the first and second wires under a second analysis condition; determining whether a sequence of the timing windows interchanges; and analyzing crosstalk occurring between the first and second wires when the interchange of the sequence occurs.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

Figure 1:
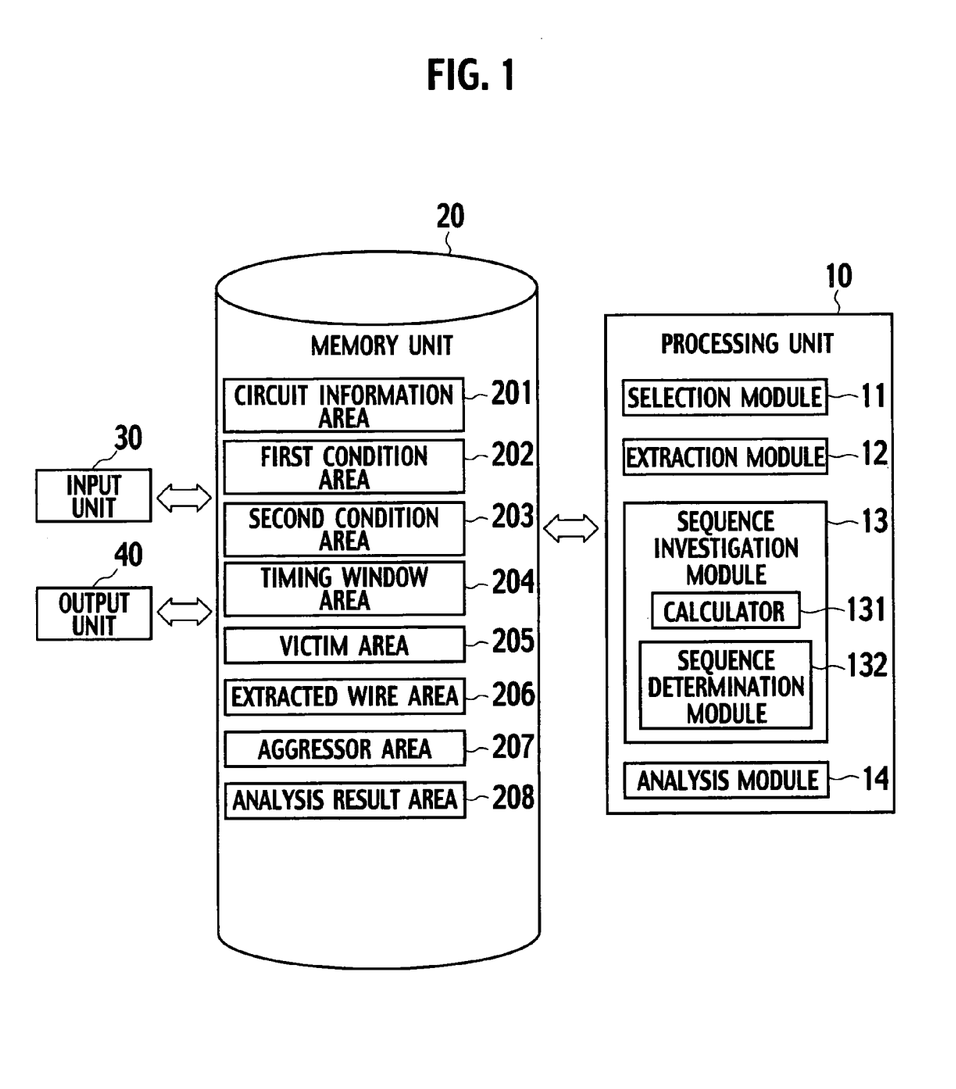
FIG. 1 is a schematic diagram showing a structure of a system according to a first embodiment of the present invention.

As shown in FIG. 1, an analysis system, according to the first embodiment of the present invention, includes a calculator 131, a sequence determination module 132 and an analysis module 14. The calculator 131 calculates the timing windows of the first and second wires under the first analysis condition and calculates the timing windows of the first and second wires under the second analysis condition. The sequence determination module 132 determines whether or not the chronological sequence of the timing windows of the first and second wires is interchanged under the first and the second analysis conditions. The analysis module 14 analyzes the crosstalk that occurs between the first and second wires when an interchange of the chronological sequence occurs.

When there is a chronological overlapping of the timing windows of the first and second wires under at least one of the first and the second analysis conditions, the analysis module 14 analyzes crosstalk between the first and second wires.

The first analysis condition and the second analysis condition affect signal delay with respect to the ambient temperature of the semiconductor integrated circuit, power supply voltage of the semiconductor integrated circuit, dispersion of the process conditions used for manufacturing the semiconductor integrated circuit, and the like. For example, an analysis condition in which the signal delay is a maximum is set as the first analysis condition, and the analysis condition in which the signal delay is a minimum is set as the second analysis condition.

The analysis condition in which the signal delay is a maximum is, for example, a condition in which the power supply voltage of the semiconductor integrated circuit is low, the ambient temperature of the semiconductor integrated circuit is high, and a process condition to make the current, flowing in a transistor included in the semiconductor integrated circuit, small. The analysis condition in which the signal delay is a minimum is, for example, a condition in which the power supply voltage of the semiconductor integrated circuit is high, the ambient temperature of the semiconductor integrated circuit is low, and a process condition to make the current large. The process condition is determined by the parameters of gate length, gate width, and gate insulator thickness of the transistor. The analysis condition, under which the signal delay is the maximum or the signal delay is the minimum, can be determined for a single target condition by calculating the signal delay time by changing to the single target condition and fixing all other conditions that affect signal delay.

The first wire and second wire, in the case of analyzing crosstalk delay, is the victim and the aggressor, respectively. In the case of analyzing crosstalk glitch, the first wire and second wire are aggressors that affect the same victim.

As shown in FIG. 1, the analysis system according to the first embodiment of the present invention includes a processing unit 10, a memory unit 20, an input unit 30 and an output unit 40. The processing unit 10 includes a selection module 11, an extraction module 12, a sequence investigation module 13 and an analysis module 14. The calculator 131 and the sequence determination module 132 are included in the sequence investigation module 13.

The selection module 11 selects the wire, from among a plurality of wires included in the circuit information, affected by crosstalk to be analyzed as a victim. The extraction module 12 extracts a wire from among the wires included in the circuit information, which has the possibility of affecting the victim selected by the selection module 11.

The memory unit 20 includes a circuit information area 201, a first condition area 202, a second condition area 203, a timing window area 204, a victim area 205, an extracted wire area 206, an aggressor area 207 and an analysis result area 208. The circuit information area 201 stores circuit information of the semiconductor integrated circuit. Circuit information includes information necessary to consider the crosstalk influence among the wires, such as layout information, electrical connection information, and logic information and the like. The first condition area 202 stores the first analysis condition. The second condition area 203 stores the second analysis condition. The first and the second analysis conditions include a condition pertaining to at least one of an ambient temperature of the semiconductor integrated circuit, a power supply voltage of the semiconductor integrated circuit and a parameter of processes used for manufacturing the semiconductor integrated circuit. The timing window area 204 stores the timing window calculated by the calculator 131. The victim area 205 stores identity of the victim selected by the selection module 11. The extracted wire area 206 stores identity of the wire extracted by the extraction module 12. The aggressor area 207 stores the wire having a timing window that overlaps the timing window of the victim selected by the selection module 11. The analysis result area 208 stores an analysis result.

The input unit 30 includes a keyboard, a mouse pointer, a light pen, and a flexible disk unit or other equivalent elements. A person responsible for analyzing the crosstalk uses the input unit 30 to designate input/output data. Moreover, setting an output data format via the input unit 30 is possible, and inputting an instruction for setting the analysis condition and/or stopping that execution is also possible.

The output unit 40 includes a display and a printer, which display an analysis result, or a recording unit, which stores information in a computer readable recording medium. A 'computer readable recording medium' refers to a medium such as an external storage unit for a computer, a semiconductor memory, a magnetic disk, or an optical disk, which may store electronic data. More specifically, a 'computer readable recording medium' may be a flexible disk, a compact disk read only memory (CD-ROM), or a magneto-optics (MO) disk.

Figure 2:
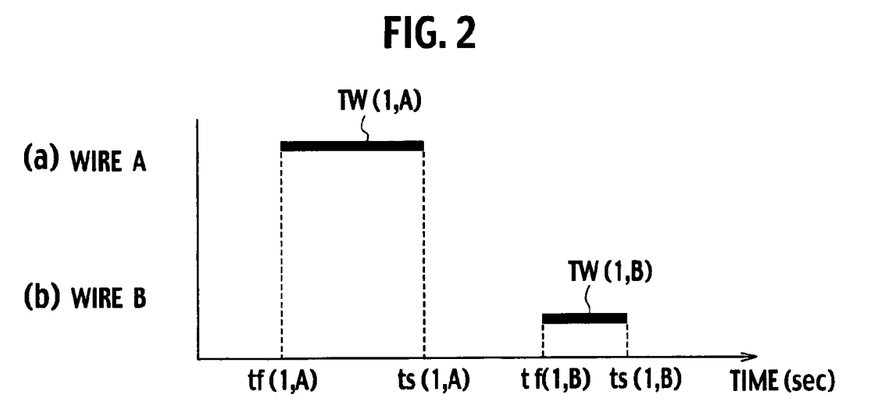
FIG. 2 is a timing chart showing a timing window calculated under the first analysis condition using a method according to the first embodiment of the present invention.
Figure 3:
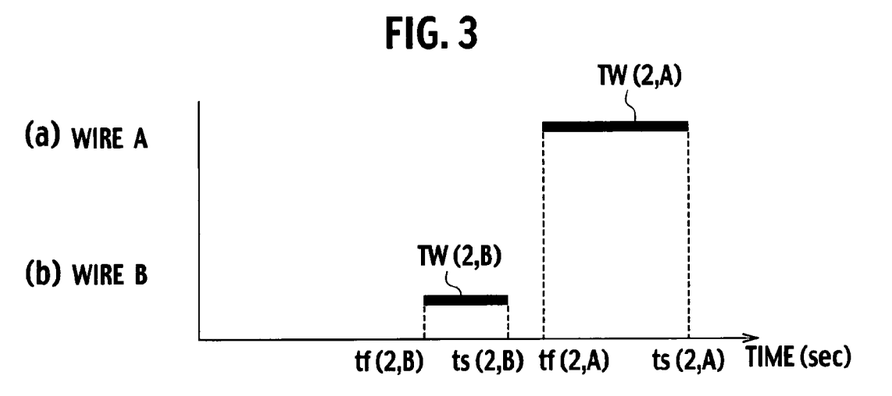
FIG. 3 is a timing chart showing a timing window calculated under the second analysis condition using a method according to the first embodiment of the present invention.
Figure 4:
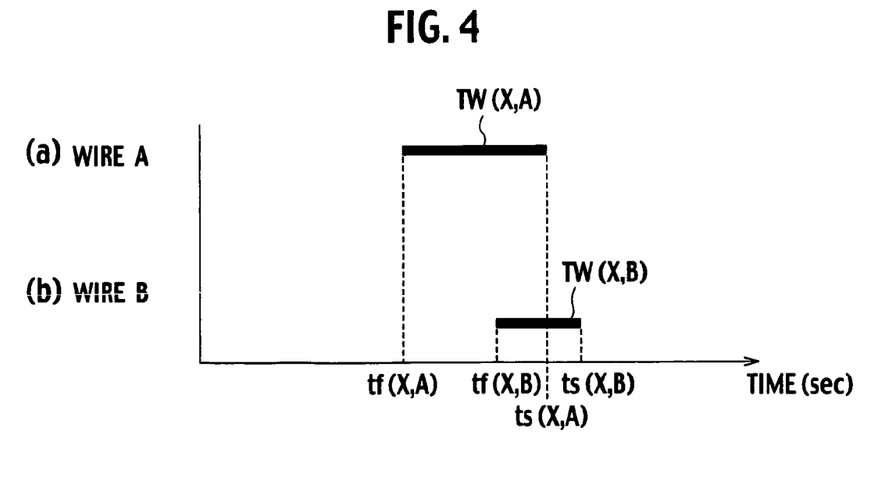
FIG. 4 is a timing chart showing a timing window calculated under the medium analysis condition using a method according to the first embodiment of the present invention.

An example in which the timing window of the first wire ("wire A") and the second wire ("wire B") overlap is described by referring to the timing charts shown in FIGS. 2 through 4.

FIG. 2 shows timing window TW (1,A) of wire A and timing window TW (1, B) of wire B calculated under the first analysis condition. Timing window TW (1, A) of wire A is specified by time tf (1, A) through ts (1, A). Timing window TW (1, B) of wire B is specified by time tf (1, B) through ts (1, B). As shown in FIG. 2, timing window TW (1, A) is earlier than timing window TW (1, B), timing window TW (1, A) and timing window TW (1, B) do not overlap.

FIG. 3 shows timing window TW (2, A) of wire A and timing window TW (2, B) of wire B calculated under the second analysis condition. Timing window TW (2, A) of wire A is specified by time tf (2, A) through ts (2, A). Timing window TW (2, B) of wire B is specified by time tf (2, B) through ts (2, B). As shown in FIG. 3, timing window TW (2, A) is later than timing window TW (2, B) and there is no overlapping of timing window TW (2, A) and timing window (2, B).

As shown in FIG. 2 and FIG. 3, the chronological sequence of the timing windows of wire A and wire B interchanges when the timing windows are calculated under the first analysis condition and when the timing windows are calculated under the second analysis condition. The timing window changes linearly with respect changes in analysis conditions. Therefore, analysis condition X, in which the timing windows of wire A and wire B overlap, exists between the first analysis condition and the second analysis condition. The analysis condition between the first analysis condition and the second analysis condition is referred to as the "medium analysis condition". The example of a timing chart, in which the timing windows of wire A and wire B overlap each other, is shown in FIG. 4. FIG. 4 shows timing window TW (X, A) of wire A and timing window TW (X, B), respectively, which are calculated under analysis condition X. Timing window TW (X, A) of wire A is specified by time tf (X, A) through ts (X, A). Timing window TW (X, B) of wire B is specified by time tf (X, B) through ts (X, B). Because tf (X, B) is larger than tf (X, A), and ts (X, A) is larger than tf (X, B), an overlapping of timing window TW (X, A) and timing window TW (X, B) exists.

When the chronological sequence of the timing windows of wire A and wire B does not interchange under the first analysis condition and the second analysis condition, a medium analysis condition does not exist.

Figure 5:
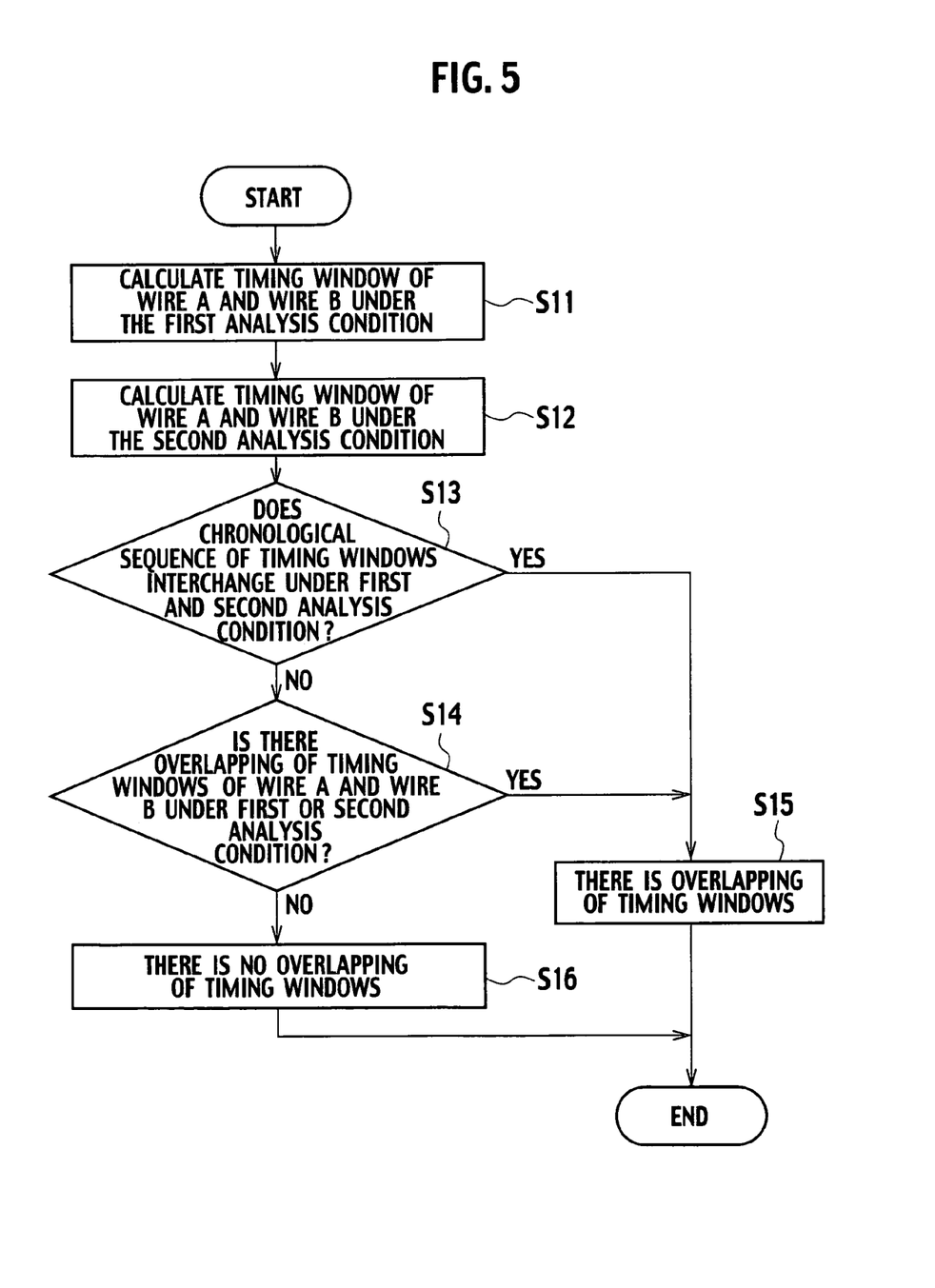
FIG. 5 is a flowchart explaining a method for investigating the overlapping of the timing windows using a method according to the first embodiment of the present invention.

A method for investigating whether or not there is an overlapping of the timing windows of wire A and wire B by the sequence investigation module 13, shown in FIG. 1, is described by referring to the flowchart shown in FIG. 5.

In the step S11, the calculator 131 reads the first analysis condition from the first condition area 202. The calculator 131 calculates timing window TW (1, A) and timing window TW (1, B) under the first analysis condition. Timing window TW (1, A) and timing window TW (1, B) are stored in timing window area 204.

In the step S12, the calculator 131 reads the second analysis condition from the second analysis area 203. The calculator 131 calculates timing window TW (2, A) and timing window TW (2, B) under the second analysis condition. Timing window TW (2, A) and timing window TW (2, B) are stored in timing window area 204.

In the step S13, the sequence determination module 132 reads timing window TW (1, A), timing window TW (1, B), timing window (2, A) and timing window (2, B) from timing window area 204. The sequence determination module 132 determines whether or not the chronological sequence of the timing windows of wire A and wire B interchanges when the timing windows of wire A and wire B are calculated under the first analysis condition and the second analysis condition. If the chronological sequence of the timing windows of wire A and wire B interchanges, processing proceeds to the step S15 and ends processing by concluding that there is the overlapping of the timing windows of wire A and wire B. If the chronological sequence of the timing windows of wire A and wire B does not interchange, processing proceeds to the step S14.

In the step S14, the sequence determination module 132 determines whether or not there is the overlapping of the timing windows of wire A and wire B under at least one of the first analysis condition and the second analysis condition. In other words, the sequence determination module 132 determines whether or not there is the overlapping of the timing window TW (1, A) and the timing window TW (1, B) or the overlapping of the timing window TW (2, A) and the timing window TW (2, B). When there is the overlapping of the timing windows, processing proceeds to the step S15 and ends processing by concluding that there is the overlapping of the timing windows of wire A and wire B. When there is no overlapping of the timing windows, processing proceeds to the step S16 and ends processing by concluding that there is no overlapping of the timing windows of wire A and wire B.

As described above, the sequence investigation module 13 investigates whether there is the overlapping of the timing windows of wire A and wire B under one of the first analysis condition, the second analysis condition and the medium analysis condition, based on the timing windows of wire A and wire B calculated under the first analysis condition and the second analysis condition.

Figure 6:
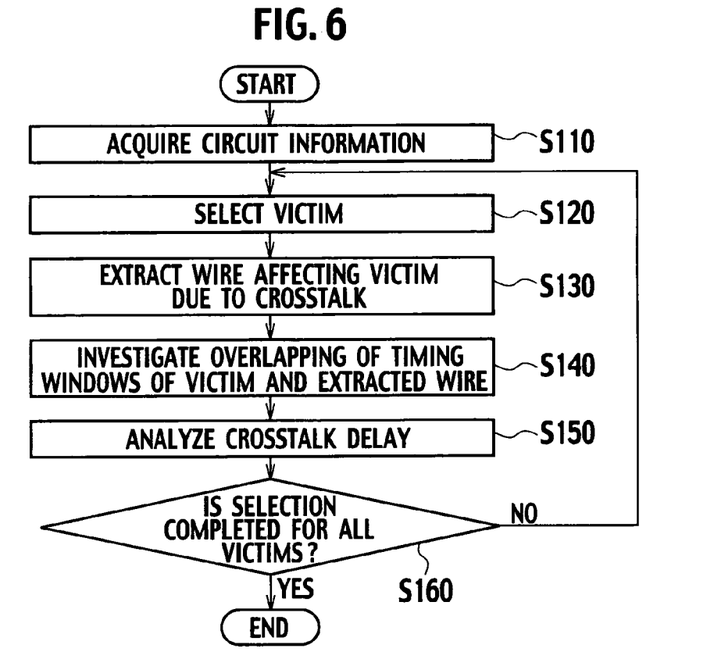
FIG. 6 is a flowchart explaining a method according to the first embodiment of the present invention.

The method for analyzing crosstalk delay by the analysis system, shown in FIG. 1, is described by referring to the flowchart shown in FIG. 6.

In the step S110, circuit information of the semiconductor integrated circuit is stored in circuit information area 201 via the input unit 30, shown in FIG. 1. The first analysis condition and the second analysis condition are stored in the first condition area 202 and the second condition area 203, respectively.

In the step S120, the selection module 11 reads circuit information from the circuit information area 201. The selection module 11 selects a wire to be analyzed as the victim. The selected wire is hereafter referred to as the "selected victim". The selected victim is stored in the victim area 205.

In the step S130, the extraction module 12 reads circuit information and the selected victim from the circuit information area 201 and the victim area 205, respectively. The extraction module 12 extracts all wires having a possibility of affecting the selected victim due to crosstalk, from among the wires included in the circuit information. The extracted wires are, for example, capacity coupled with the selected victim. The wire extracted by the extraction module 12 is referred to as the "extracted wire". The extracted wire is stored in the extracted wire area 206.

In the step S140, the sequence investigation module 13 reads circuit information and selected victim information from the circuit information area 201 and the victim area 205, respectively. The sequence investigation module 13, reads information of the extracted wires from the extracted wire area 206, one by one. The sequence investigation module 13 investigates whether or not there is the chronological overlapping of the timing windows of the extracted wire and the selected victim in the same manner as described with reference to FIG. 5. The extracted wire that has the chronological overlapping of the timing windows with the selected victim is stored as the aggressor in the aggressor area 207. Processing proceeds to the step S150 when all overlapping of the timing windows of the selected victim and the extracted wires stored in the extracted wire area 206 has been investigated.

In the step S150, the analysis module 14 reads circuit information and information of the selected victim from the circuit information area 201 and the victim area 205, respectively. The analysis module 14 reads information of the aggressor from the aggressor area 207. The analysis module 14 analyzes the crosstalk influence of the aggressor that affects the selected victim. For example, the analysis module 14 calculates the crosstalk delay value, which is the difference in the delay time of the signal level of the victim between when the signal level of the victim and aggressor changes at the same time and when the signal level of the victim and aggressor do not changes at the same time. The delay time of the signal level of the victim and the aggressor is calculated by simulation and the like based on circuit information. The analysis result of the crosstalk delay value and the like are stored in the analysis result area 208. Processing proceeds to the step S160 after analyzing the crosstalk influence of all the aggressors that affect the selected victim.

In the step S160, the selection module 11 determines whether or not all wires to be analyzed have been selected. If all wires have been selected, then the processing is complete. If there are any unselected wires, processing returns to the step S120.

The analysis result stored in the analysis result area 208 may be supplied from the analysis system via the output unit 40. It is determined from the analysis result whether the influence of crosstalk delay has caused a malfunction in the semiconductor integrated circuit. If so then countermeasures such as layout modification and the like are implemented. Using the circuit information after countermeasures have been implemented, the crosstalk influence is analyzed again.

As described above, by the analysis system according to the first embodiment of the present invention, using only the calculation result of the timing windows under the first analysis condition and the second analysis condition, it is possible to investigate whether or not there is the overlapping of the timing windows under the first analysis condition, the second analysis condition and the medium analysis condition, respectively. As a result, the number of analysis conditions for investigating the overlapping of the timing windows is reduced, and the time required to analyze the influence of crosstalk delay is reduced.

Modification

In the above, the method for analyzing crosstalk delay by the analysis system, shown in FIG. 1, is described. The following explains the method for analyzing crosstalk glitch by the analysis system, shown in FIG. 1, by referring to the flowchart shown in FIG. 7.

Figure 7:
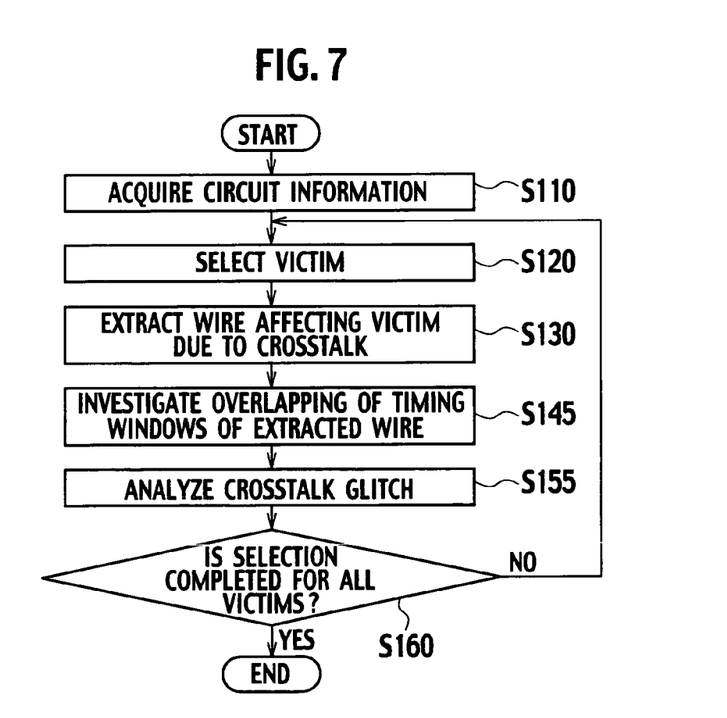
FIG. 7 is a flowchart explaining a method according to the first embodiment of the present invention.

In the steps S110 through S130, a selected victim is selected and the extracted wires, which have a possibility of affecting the selected victim due to crosstalk are extracted from among the wires included in the circuit information, in the same manner as described with reference to FIG. 6.

In the step S145, the sequence investigation module 13 reads circuit information from the circuit information area 201. The sequence investigation module 13 reads two extracted wires as a wire group from the extracted wire area 206. The sequence investigation module 13 investigates whether or not there is the overlapping of the timing windows of the extracted wires of the wire group in the same manner as described with reference to FIG. 5. More specifically, the calculator 131 calculates the timing windows of the extracted wires of the wire group under the first and second analysis conditions, respectively. The sequence determination module 132 determines whether or not there is the overlapping of the timing windows under at least one of the first analysis condition and second analysis condition. If there is the overlapping of the timing windows of the wires included in the wire group, the wire group information is stored in the aggressor area 207 as an aggressor group. If the overlapping of the timing windows has been investigated for the combination of all extracted wires stored in the extracted wire area 206, then processing proceeds to the step S155.

In the step S155, the analysis module 14 reads the circuit information and the aggressor group information from the circuit information area 201 and the aggressor area 207, respectively. The analysis module 14 analyzes the crosstalk influence of the aggressor group that affects the selected victim. More specifically, the analysis module 14 calculates the size of the pulse that occurs in the selected victim when each signal level of wires included in the aggressor group changes at the same time. The size of the pulse that occurs in the selected victim is calculated by simulation and the like based on circuit information. When the crosstalk influence on the victim has been analyzed for all the aggressor groups, then processing proceeds to the step S160.

In the step S160, the selection module 11 determines whether or not all wires to be analyzed have been selected. If all the wires have been selected, the processing is completed. If there are any unselected wires, processing returns to the step S120.

As described above, by the analysis system according to the modification of the first embodiment of the present invention, using only the calculation result of the timing windows under the first analysis condition and the second analysis condition, it is possible to investigate whether or not there is the overlapping of the timing windows under the first analysis condition, the second analysis condition and the medium analysis condition, respectively. As a result, the number of analysis conditions for investigating the overlapping of the timing windows is reduced, and the time required to analyze the influence of crosstalk glitch is reduced.

Second Embodiment

Figure 8:
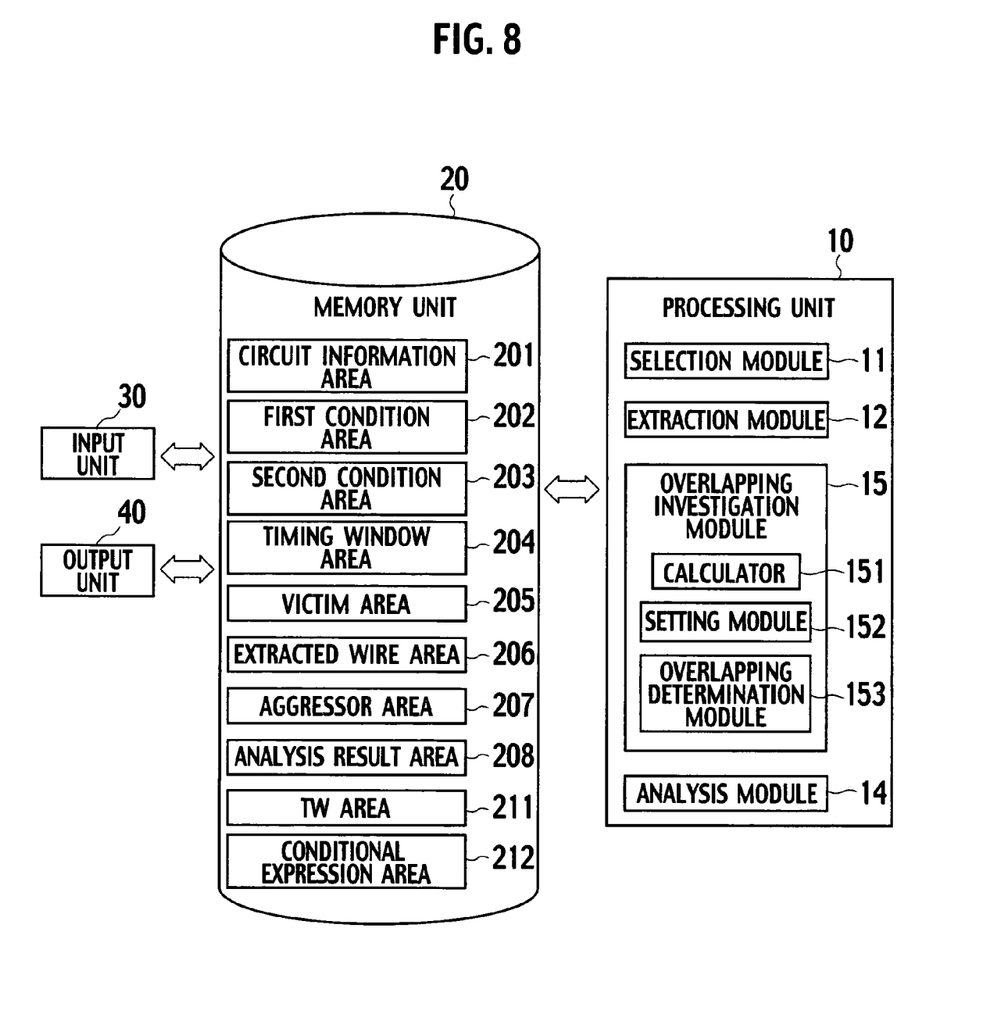
FIG. 8 is a schematic diagram showing a structure of a system according to a second embodiment of the present invention.

The analysis system according to the second embodiment of the present invention differs from the analysis system, shown in FIG. 1, in that the analysis system, as shown in FIG. 8, includes an overlapping investigation module 15. The overlapping investigation module 15 includes a calculator 151, a setting module 152 and an overlapping determination module 153.

The calculator 151 calculates the timing windows of the wires included in the integrated semiconductor circuit under the first analysis condition and the second analysis condition, respectively. The setting module 152 sets an overlapping conditional expression group, in which variables are coefficient, which determines the medium analysis condition between the first analysis condition and the second analysis condition, and the overlap time, at which the timing windows of a plurality of the wires overlap with each other, based on the timing windows. The overlapping determination module 153 determines whether or not there is a solution for the coefficient and the overlap time, which satisfy the overlapping conditional expression group. When there is a solution, the analysis module 14 analyzes the crosstalk occurring between the wires.

The analysis system, shown in FIG. 8, includes the TW area 211 and a conditional expression area 212. The TW area 211 stores the TW region demarcated by the setting module 152. The term "TW region" will be explained later. The conditional expression area 212 stores the overlapping conditional expression group set by the setting module 152.

"A plurality of wires" refers to the victim and the aggressor, in cases where the crosstalk delay is analyzed. A plurality of wires are aggressors that affect similar victims due to crosstalk, in cases where crosstalk glitch is analyzed. The overlapping conditional expression group includes the conditional expressions set for each wire, respectively. A detailed explanation of the overlapping conditional expression group and the conditional expression is to follow.

A method for investigating whether or not there is the overlapping of the timing windows of wires by the overlapping investigation module 15, shown in FIG. 8, is described below.

Figure 9:
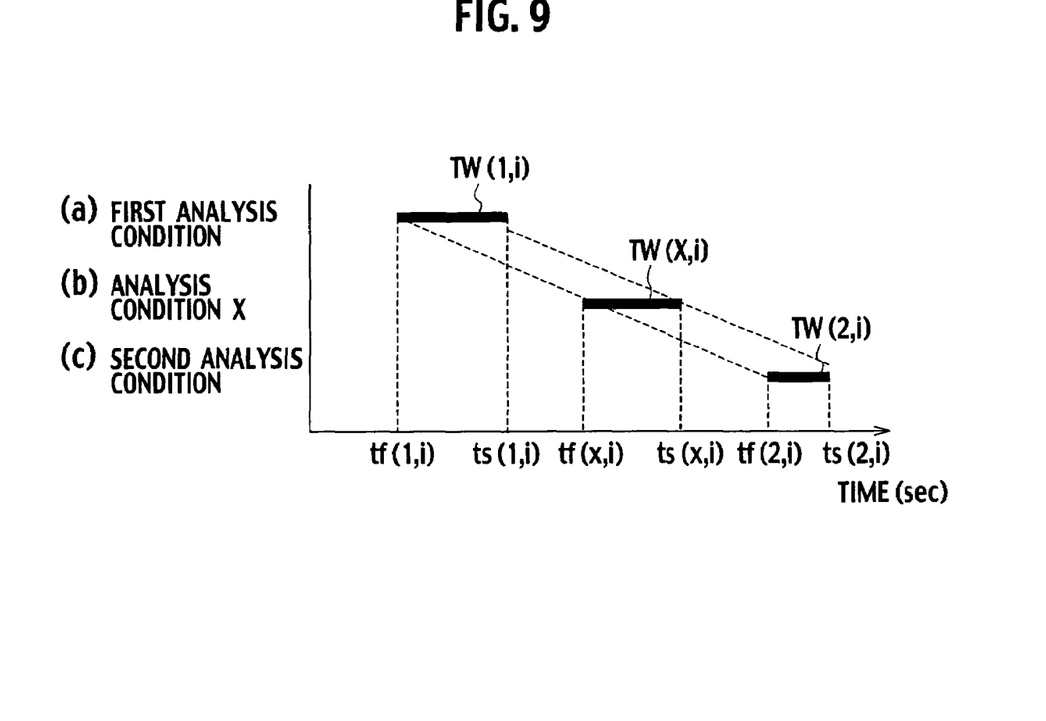
FIG. 9 is a timing chart showing a timing window calculated under the medium analysis condition using a method according to the second embodiment of the present invention.

As shown in FIG. 9, timing window TW $(1, i)$ of wire L $(i)$ is specified by time tf $(1, i)$ through ts $(1, i)$ under the first analysis condition (i: nonnegative integer). Timing window TW $(2, i)$ of wire L $(i)$ is specified by time tf $(2, i)$ through ts $(2, i)$ under the second analysis condition. Timing window TW $(X, i)$ of wire L $(i)$ is specified by time tf $(X, i)$ through ts $(X, i)$ under the medium analysis condition X between the first analysis condition and the second analysis condition. The timing window changes linearly with regard to changes in the analysis condition. Therefore, times tf $(X, i)$ and ts $(X, i)$ are specified by conditional expressions (1) and (2) using the coefficient x:

$$tf(X, i)=tf(1, i) \times x+tf(2, i) \times (1-x) \quad (1)$$

$$ts(X, i)=ts(1, i) \times x+ts(2, i) \times (1-x) \quad (2)$$

Here, the coefficient x is zero or more, or one or less. The medium analysis condition X is the first analysis condition when x=1. The medium analysis condition X is the second analysis condition when x=0.

Figure 10:
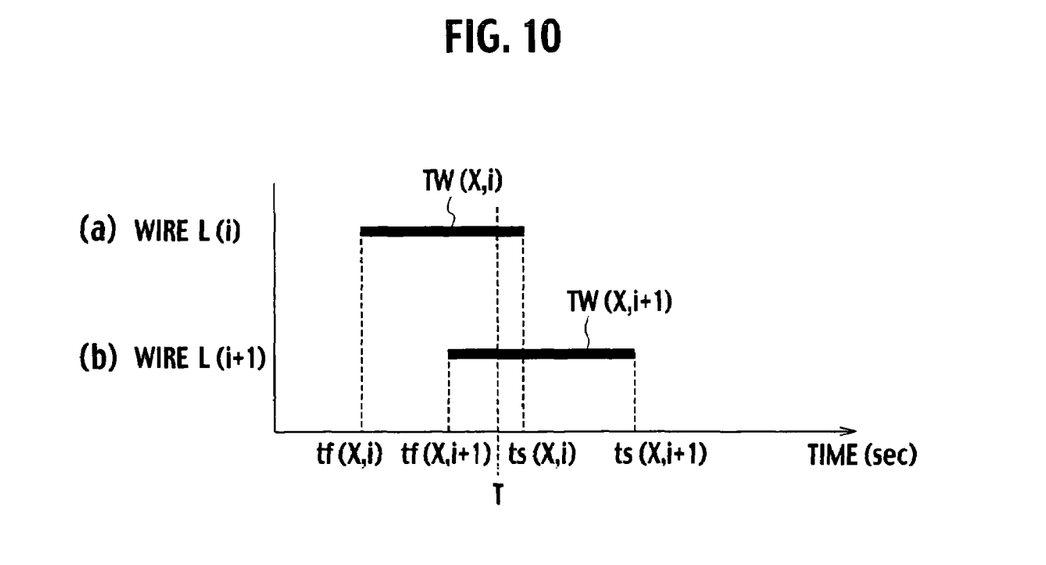
FIG. 10 is a timing chart explaining the condition under which a plurality of timing windows overlap each other.

It is assumed that the timing window TW $(X, i)$ of the wire L $(i)$ and the timing window TW $(X, i+1)$ of wire L $(i+1)$ overlap at the overlap time T under the medium analysis condition X. As shown in FIG. 10, in order to include the overlap time T in the timing window $(X, i)$ of the wire L $(i)$ under the medium analysis condition X, it is necessary for the overlap time T to satisfy the following conditional expressions (3) and (4):

$$tf(X, i)=T \text{ or less} \quad (3)$$

$$ts(X, i)=T \text{ or more} \quad (4)$$

In a case where wire L $(i+1)$ satisfies the following conditional expressions (3a) and (4a), the timing windows of wire L $(i)$ and wire L $(i+1)$ overlap at the overlap time T under the analysis condition X:

$$tf(X, i+1)=T \text{ or less} \quad (3a)$$

$$ts(X, i+1)=T \text{ or more} \quad (4a)$$

The medium analysis condition X, under which the timing windows of wire L $(i)$ and wire L $(i+1)$ overlap, is determined by the coefficient x. In order to investigate whether or not there is the overlapping of the timing windows of n wires, the solution for the coefficient x and the overlap time T which simultaneously satisfy the conditional expression (3) and conditional expression (4), which are set for the timing windows of n wires, respectively, is investigated (n: nonnegative integer).

A set of conditional expressions for each wire is referred to as the "overlapping conditional expression". In a case where there is a solution of time T and the coefficient x, which satisfy the overlapping conditional expression group which includes the conditional expressions for the n wires, there is the overlapping of the timing windows of the n wires.

Figure 11:
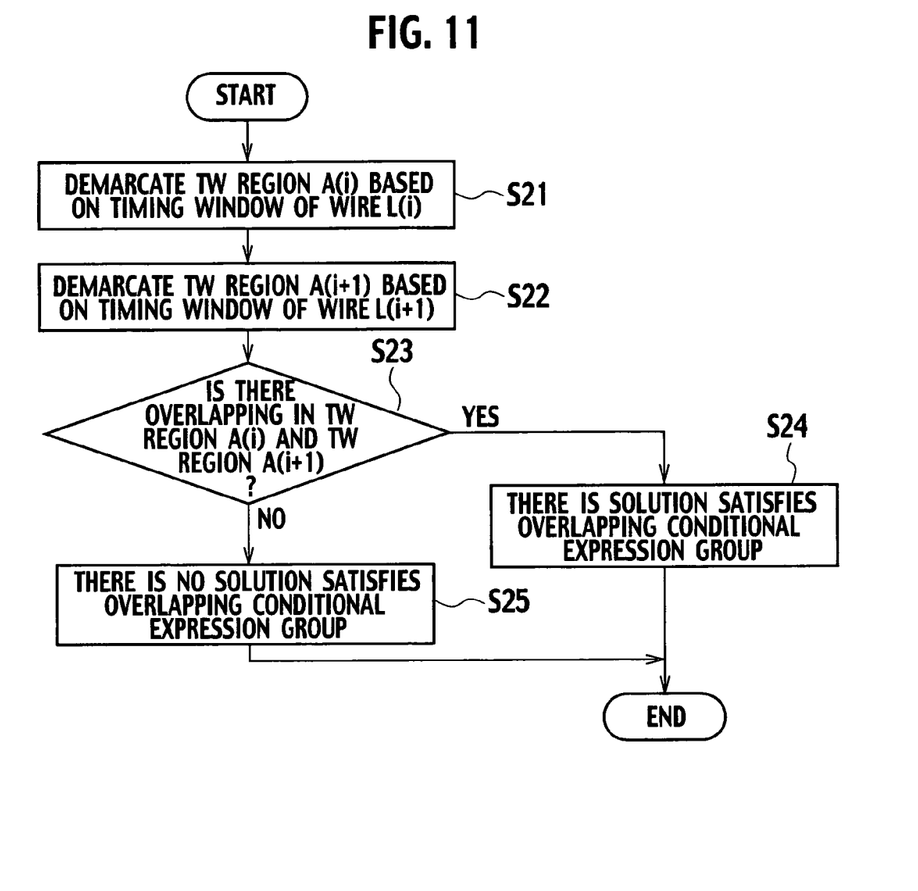
FIG. 11 is a flowchart explaining a method for investigating the overlapping of the timing windows using a method according to the second embodiment of the present invention.

An example of the method for investigating whether there is a solution for the coefficient x and the overlap time T which satisfies the overlapping conditional expression group is described by referring to the flowchart shown in FIG. 11.

Figure 12:
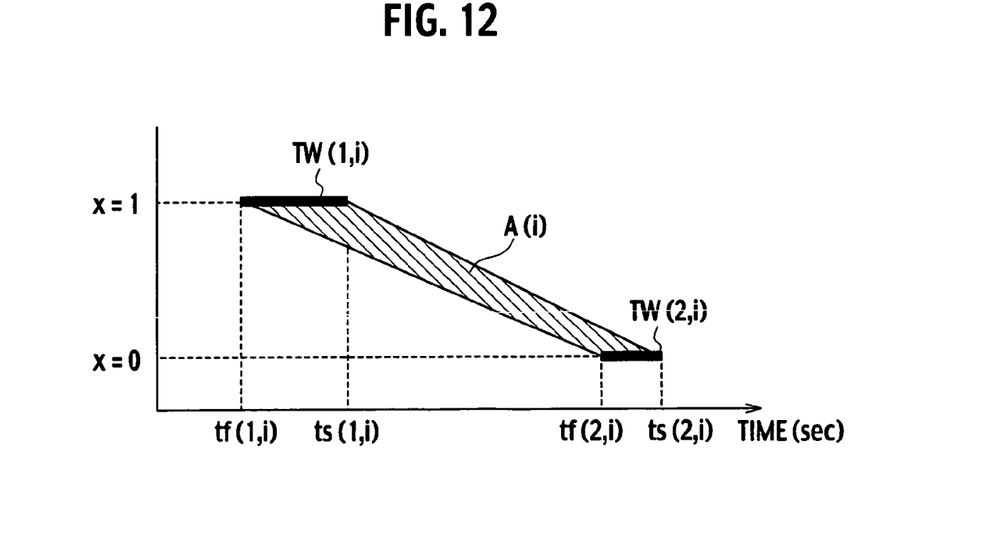
FIG. 12 is a timing chart explaining a method for demarcating a TW region using a method according to the second embodiment of the present invention.

In the step S21, calculator 151 reads the circuit information, the first analysis condition and the second analysis condition from the circuit information area 201, the first condition area 202, and the second condition area 203. The calculator 151 calculates the timing window TW $(1, i)$ of wire L $(i)$ under the first analysis condition and the timing window TW $(2, i)$ of wire L $(i)$ under the second analysis condition. The setting module 152 sets conditional expressions (1) and (2) which specify the timing window of wire L $(i)$ under the medium analysis condition X, based on the timing window TW $(1, i)$ and the timing window TW $(2, i)$. The setting module 152 demarcates the TW region A (i) using the conditional expressions (1) and (2), as shown in FIG. 12. The TW region A (i) is demarcated by time tf (1, i) through time ts (1, i), which specify the timing window (1, i), and time tf (2, i) through time ts (2, i), which specify the timing window (2, i). The vertical axis of FIG. 12 is the coefficient x and the horizontal axis expresses time. The demarcated TW region A (i) is stored in the TW area 211.

Figure 13:
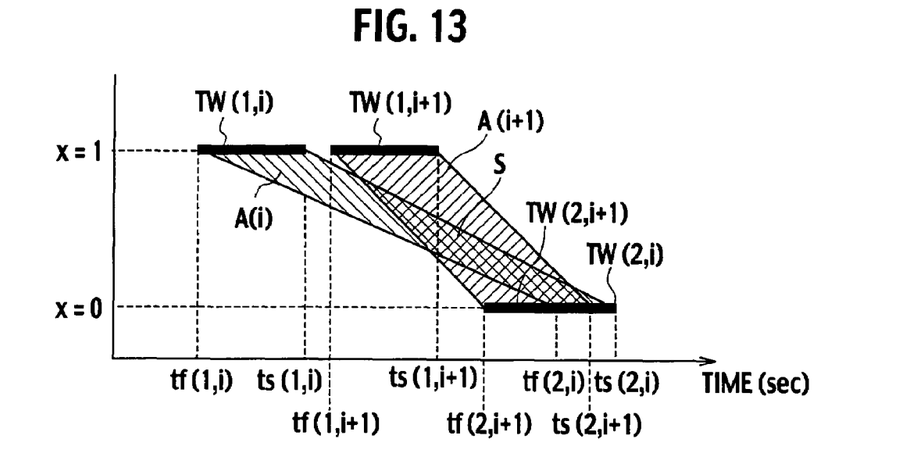
FIG. 13 is a flowchart explaining a method for investigating the overlapping of the timing windows using a method according to the second embodiment of the present invention.

In the step S22, the calculator 151 calculates the timing window TW (1, i+1) of wire L (i+1) under the first analysis condition and the timing window TW (2, i+1) of wire L (i+1) under the second analysis condition. The setting module 152 sets the conditional expressions (1) and (2) which specify the timing window of wire L (i+1) under the analysis condition X, based on timing window TW (1, i+1) and timing window TW (2, i+1). The setting module 152 demarcates the TW region A (i+1) using the conditional expressions (1) and (2), as shown in FIG. 13. The TW region A (i+1) is demarcated by th time tf (1, i+1) through time ts (1, i+1), which specify the timing window TW (1, i+1), and time tf (2, i+1) through time ts (2, i+1), which specify the timing window TW (2, i+1). The demarcated TW region A (i+1) is stored in TW area 211.

In the step S23, the setting module 152 sets conditional expressions (3) and (4) for the wire L (i) and wire L (i+1), respectively. The setting module 152 sets the overlapping conditional expression group including the conditional expressions (3) and (4) for wire L (i) and wire L (i+1). The overlapping conditional expression group is stored in the conditional expression area 212. The overlapping determination module 153 reads the overlapping conditional expression group including the conditional expressions for wire L (i) and wire L (i+1), from the conditional expression area 212. The overlapping determination module 153 determines whether or not there is a coefficient x and overlap time T, which satisfy the overlapping conditional expression group, in the method described below. The overlapping determination module 153 reads TW region A (i) and TW region A (i+1) from the TW area 211. The overlapping determination module 153 determines whether or not there is an overlap in TW region A (i) and TW region A (i+1). As shown in FIG. 13, in a case where there is an "overlapping region S" in TW region A (i) and TW region A (i+1), there is a solution for the coefficient x and the overlap time T that satisfies the overlapping conditional expression group. If there is an overlapping region S, processing proceeds to the step 24, when there is a solution for the coefficient x and the overlap time T that satisfies the overlapping conditional expression group. Then, the processing is complete. If there is no overlapping between TW region A (i) and TW region A (i+1), there is no solution for the coefficient x and the overlap time T that satisfies the overlapping conditional expression group. If there is no overlapping between TW region A (i) and TW region A (i+1), processing proceeds to the step 25 and the processing is completed without a solution for the coefficient x and the overlap time T that satisfies the overlapping conditional expression group.

When investigating whether there is a solution for the coefficient x and the overlap time T for three or more wires, in the same method as described above, the TW regions of each wire is specified, respectively, based on the timing window of each wire, and an investigation is made as to whether or not there is an overlapping region S in which all the TW regions overlap. When there is an overlapping region S, there is a solution for the coefficient x and the overlap time T that satisfies the overlapping conditional expression group including conditional expressions for all the wires. In other words, there is an analysis condition X under which the timing windows of each of the wires overlap each other.

In the example described above, the overlapping determination module 153 determines whether or not there is a solution for the coefficient x and the overlap time T that satisfies the overlapping conditional expression group, by investigating the demarcated TW region, based on the time that specifies the timing windows of each wire. In methods other than the one described above, for example, when solving for the overlapping conditional expression group by using linear programming and the like, it is possible to determine whether or not there is a solution for the coefficient x and the overlap time T.

Figure 14:
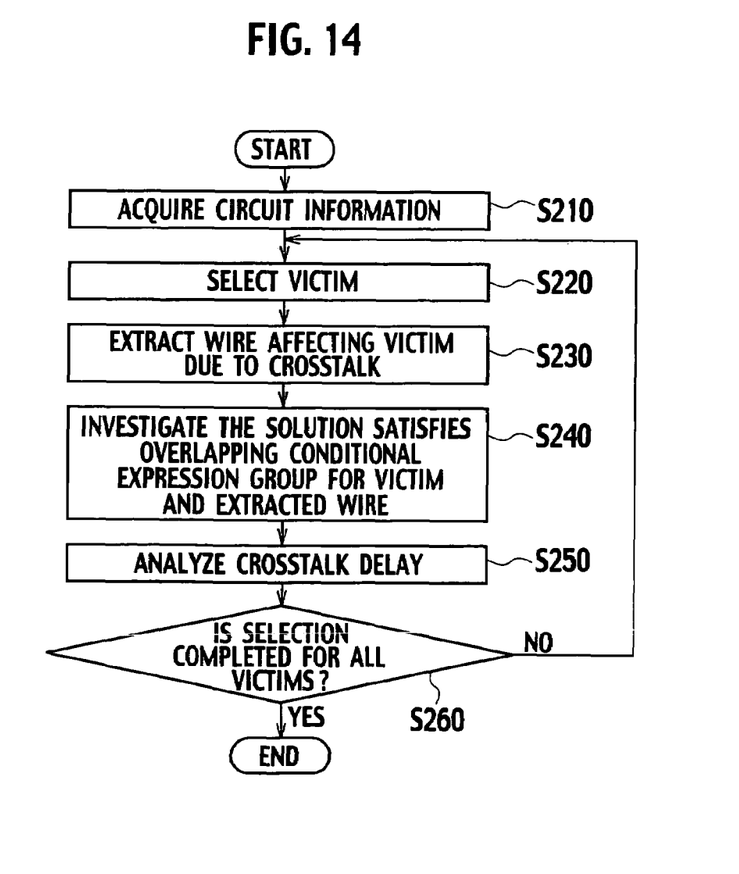
FIG. 14 is a flowchart explaining a method according to the second embodiment of the present invention.

The method for analyzing crosstalk delay by the analysis system, shown in FIG. 8, is described by referring to the flowchart shown in FIG. 14.

In the step S210, circuit information of the semiconductor integrated circuit is stored in circuit information area 201 via input unit 30, shown in FIG. 8. The first analysis condition and the second analysis condition are stored in first condition area 202 and second condition area 203, respectively.

In the step S220, the selection module 11 reads circuit information from circuit information area 201. The selection module 11 selects the wire to be analyzed as a selected victim. Information of the selected victim is stored in victim area 205.

In the step S230, the extraction module 12 reads circuit information and the selected victim information from circuit information area 201 and victim area 205, respectively. The extraction module 12 extracts all wires having a possibility of affecting the selected victim, due to crosstalk, from among the wires included in the circuit information. Information of the extracted wires is stored in the extracted wire area 206. Here, the number of extracted wires is n.

In the step S240, the overlapping investigation module 15 reads circuit information and the selected victim information from the circuit information area 201 and the victim area 205, respectively. The. overlapping investigation module 15 selects n-j number of extracted wires (j=0 through n−1). The overlapping investigation module 15 reads, from the extracted wire area 206, n-j extracted wires which had been selected. The overlapping investigation module 15 investigates whether or not there is the overlapping of the timing window of the selected n-j extracted wires and the selected victim. That is, using the method described in FIG. 11, the overlapping investigation module 15 investigates whether or not there is a solution for the coefficient x and the overlap time T that satisfies the overlapping conditional expression group, which was set based on the timing windows of the selected n-j extracted wires and of the selected victim. In a case where a solution exists of the coefficient x and the overlap time T, there is an analysis condition X, under which the timing window of the selected victim and the timing windows of the n-j wires overlap. When there is a solution for the coefficient x and the overlap time T, the n-j extracted wires are stored as an aggressor group in the aggressor area 207. When the n-j extracted wires are selected from among the extracted wires stored in the extracted wire area 206, n extracted wires are first selected and investigated for the existence of a solution for the coefficient x and the overlap time T. Then, n−1 extracted wires are selected and a solution for the coefficient x and the overlap time T is investigated for all of the combination of n−1 extracted wires. The overlapping conditional expression group is set and investigated for a solution for the coefficient x and the overlap time T, reducing the number of selected extracted wires. In other words, the setting module 152 sets a plurality of overlapping conditional expression groups, reducing the number of extracted wires. Therefore, the overlapping determination module 153 determines whether or not there is a solution for the coefficient x and the overlap time T that satisfies each overlapping conditional expression group. When the investigation of the solution for the coefficient x and the overlap time T is completed for all the combination of extracted wires, processing proceeds to the step S250.

In the step S250, the analysis module 14 reads circuit information, the selected victim and the aggressor group from circuit information area 201, victim area 205 and aggressor area 207, respectively. The analysis module 14 analyzes the crosstalk influence that the selected victim receives from the aggressor group, assuming that the signal level of the selected victim and the aggressors, in the aggressor group, changes at the same time. More specifically, the analysis module 14 calculates the crosstalk delay that occurs in the selected victim. The result of the analysis of the crosstalk delay is stored in analysis result area 208. When the crosstalk influence is analyzed for all aggressor groups, processing proceeds to the step S260.

In the step S260, the selection module 11 determines whether or not all wires to be analyzed have been selected. If all wires have been selected, then the processing is completed. If there are any unselected wires, processing returns to the step S220.

The analysis result stored in analysis result area 208 may be supplied from the analysis system via output unit 40. Layout change counter-measures are executed in a case where it is determined from the analysis result that a malfunction in the semiconductor integrated circuit will be caused by the crosstalk influence.

It is possible to calculate the maximum crosstalk delay that occurs in the victim by analyzing the crosstalk delay under the medium analysis condition X for each aggressor group. For example, the delay value of the crosstalk with the largest influence on the performance of the semiconductor integrated circuit is calculated, by calculating the crosstalk delay value under the analysis condition when the coefficient x is a maximum and when the coefficient x is a minimum.

The overlapping investigation module 15 selects extracted wires in the step S240. However, if there is an aggressor group including n extracted wires, thereafter a selection of extracted wires is not performed. This is because the crosstalk influence on the semiconductor integrated circuit from the aggressor group including n number of extracted wires is larger than the crosstalk influence produced by an aggressor group including any other combination of extracted wires. Furthermore, when n-j extracted wires are selected, a combination of n-j extracted wires, which is included in the combination of from n to n-(j+1) aggressor groups, is not selected. For example, if an aggressor group includes extracted wires L (1), L (2) and L (3), the combination extracted wire L (1) and extracted wire L (2), the combination extracted wire L (2) and extracted wire L (3) and the combination extracted wire L (1) and extracted wire L (3) are not selected. This is due to the fact that, in the case where the signal levels of two of the extracted wires in any combination noted above change at the same time, the crosstalk influence on the semiconductor integrated circuit is less than the crosstalk influence when the signal level of all three extracted wires change at the same time. Since the number of combinations of extracted wires is reduced, processing time is also reduced.

However, there is the possibility that, for example, the crosstalk influence when the signal levels of extracted wire L (1) and extracted wire L (4) change at the same time, may be larger than the instance of crosstalk influence when the signal levels of extracted wires L (1), L (2) and L (3) change at the same time. Therefore, a combination of n-j extracted wires, which is not included in a combination of from n to n-(j+1) aggressor groups, is selected.

As described above, by the analysis system according to the second embodiment of the present invention, it is possible to investigate the time at which the timing windows of a plurality of wires overlap and the analysis condition under which the timing windows of the wires overlap, using only the calculation result of the timing windows under the first analysis condition and the second analysis condition. As a result, the time required to analyze the crosstalk delay is reduced. The remainder of the analysis system is effectively the same as the first embodiment, and thus duplicated description thereof is omitted First Modification In the above, the method for analyzing crosstalk delay by the analysis system, shown in FIG. 8, is described. The following describes the method for analyzing crosstalk glitch by the analysis system, shown in FIG. 8, by referring to the flowchart shown in FIG. 15.

Figure 15:
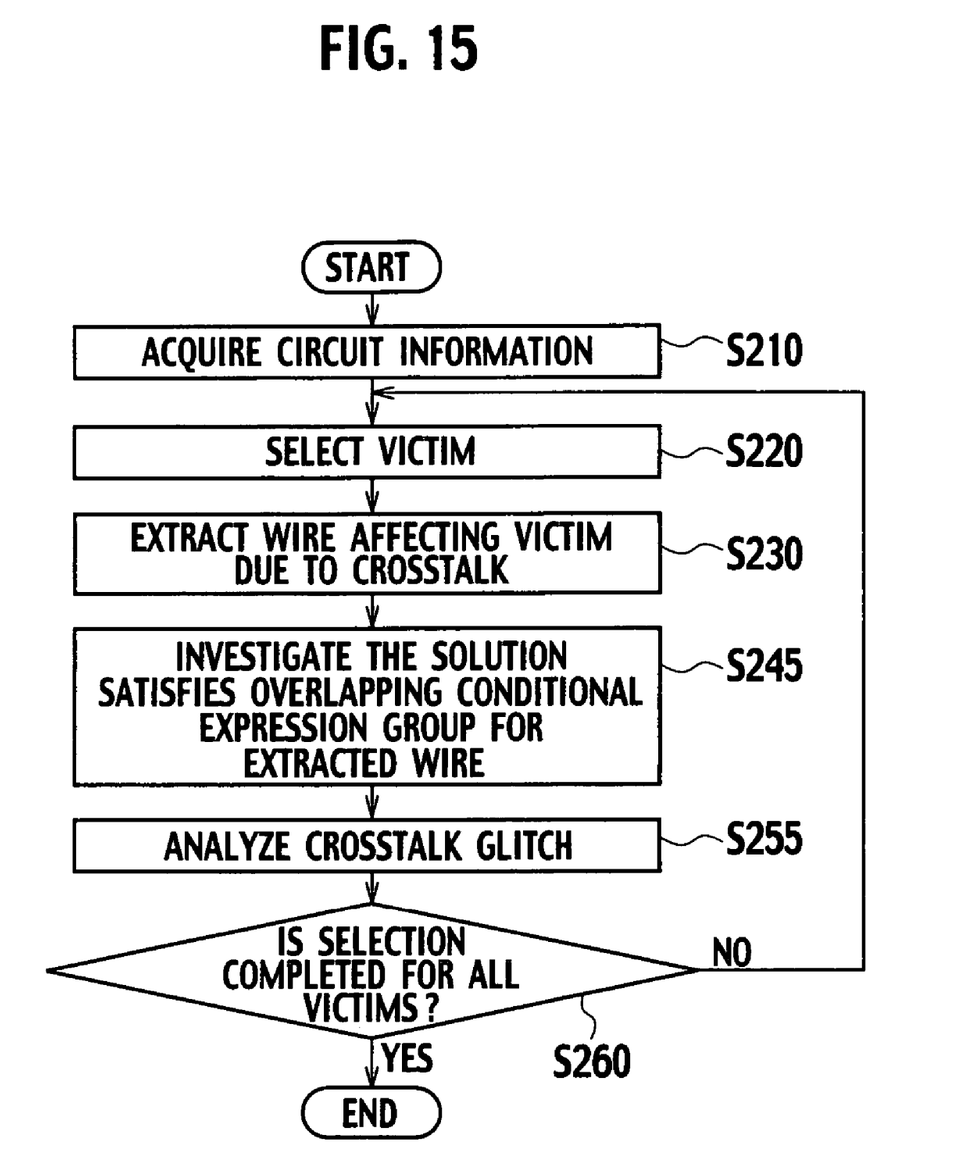
FIG. 15 is a flowchart explaining a method according to the second embodiment of the present invention.

In the steps S210 through S230, the selected victim and all extracted wires with the possibility of affecting the selected victim due to crosstalk are selected from among the wires included in the circuit information, in the same manner as described with reference to FIG. 14.

In the step S245, the overlapping investigation module 15 reads the circuit information from circuit information area 201. The overlapping investigation module 15 selects and reads n-j number of extracted wires from extracted wire area 206. The overlapping investigation module 15 investigates whether there is an overlapping of the timing windows of the n-j extracted wires. More specifically, the overlapping investigation module 15, using the methods described in FIG. 11, investigates whether there is a solution for the coefficient x and the overlap time T that satisfies the overlapping conditional expression group, which is set based on the timing windows of the selected n-j extracted wires. In a case where there is a solution for the coefficient x and the overlap time T, information of the n-j extracted wires is stored in the aggressor area 207 as an aggressor group. When the investigation of the existence of a solution for the coefficient x and the overlap time T is completed for all the combinations of extracted wires, processing proceeds to the step S255.

In the step S255, the analysis module 14 reads the circuit information and the aggressor group from circuit information area 201 and aggressor area 207, respectively. The analysis module 14 analyzes the crosstalk influence that the selected victim receives from the aggressor group. More specifically, the analysis module 14 calculates the size of the pulse that occurs in the selected victim when each signal level of the aggressors included in the aggressors groups change at the same time. If the crosstalk influence on the selected victim is analyzed for all the aggressor groups, then processing proceeds to the step S260.

In the step S260, the selection module 11 determines whether or not all wires to be analyzed have been selected. If all wires have been selected, then the processing is complete. If there are any unselected wires, processing returns to the step S220.

As in the above description, by the analysis system according to the first modification of the second embodiment of the present invention, it is possible to investigate the time at which the timing windows of a plurality of wires overlap, and the analysis condition, under which the timing windows of wires overlap, using only the calculation result of the timing windows under the first analysis condition and the second analysis condition. As a result, the time required to analyze the crosstalk glitch is reduced.

Second Modification

In the above, in the step S240 shown in FIG. 14, the method for investigating the solution for the coefficient x and the overlap time T, by reducing the number of extracted wires selected from the extracted wire area 206 was described. The following explains the method for investigating the solution for the coefficient x and the overlap time T, by increasing the number of extracted wires selected.

The overlapping investigation module 15 selects k extracted wires from the extracted wire area 206 (k=2 through n). The overlapping investigation module 15, using the methods described in FIG. 11, sets a overlapping conditional expression group based on the timing windows of k extracted wires, and investigates whether or not there is a solution for the coefficient x and the overlap time T that satisfies the overlapping conditional expression group. In a case where there is a solution for the coefficient x and the overlap time T, information of the selected k extracted wires is stored in the aggressor area 207 as an aggressor group.

After selecting all combinations of k extracted wires, the overlapping investigation module 15 selects a single aggressor group that includes the k extracted wires stored in aggressor area 207. Furthermore, the overlapping investigation module 15 selects, from the extracted wire area 206, a single extracted wire not included in the selected aggressor group. The overlapping investigation module 15 sets the overlapping conditional expression group for the k+1 wires including the selected extracted wire and the k extracted wires included in the selected aggressor group. The overlapping investigation module 15 investigates whether or not there is a solution for the coefficient x and the overlap time T that satisfies the overlapping conditional expression group. When there is a solution for the coefficient x and the overlap time T, information of the selected extracted wire and the k extracted wires included in the selected aggressor group is stored in aggressor area 207 as the aggressor group including k+1 extracted wires. Afterwards, the overlapping investigation module 15 selects, from extracted wire area 206, another extracted wire not included in the selected aggressor group and investigates whether or not there is a solution for the coefficient x and the overlap time T that satisfies the overlapping conditional expression group in the same manner as described above. After all extracted wires not included in the selected aggressor group are selected, the overlapping investigation module 15 selects another aggressor group that includes the k extracted wires. In the same manner as described above, the overlapping investigation module 15 investigates whether or not there is a solution for the coefficient x and the overlap time T that satisfies the overlapping conditional expression group for the k+1 extracted wires.

After all aggressor groups that include the k extracted wires are selected, the overlapping investigation module 15 deletes, from aggressor area 207, the aggressor groups that includes the k extracted wires, which are included in the aggressor groups that includes the k+1 extracted wires. For example, in a case where an aggressor group includes extracted wires L (1), L (2) and L (3), the aggressor group that includes extracted wires L (1) and L (2), the aggressor group that includes extracted wires L (2) and L (3), and the aggressor group that includes extracted wires L (1) and L (3) are deleted from aggressor area 207.

In the method described above, the setting module 152 sets a plurality of overlapping conditional expression groups, increasing the number of extracted wires. Then, the overlapping determination module 153 determines whether or not there is a solution for the coefficient x and the overlap time T that satisfies each overlapping conditional expression group. In other words, in a case where n-j extracted wires are selected from the extracted wire area 206, it is possible to investigate whether or not there is a solution for the coefficient x and the overlap time T, by increasing the number of selected extracted wires.

OTHER EMBODIMENT

The first and second embodiments have been described in the example of the method for analyzing crosstalk delay and crosstalk glitch, respectively. However, it is possible to analyze crosstalk delay and crosstalk glitch at the same time.

Various modifications will become possible for those skilled in the art after receiving the teachings of the present disclosure without departing from the scope thereof.

What is claimed is:

1. A system for analyzing crosstalk occurring in a semiconductor integrated circuit, comprising:
    a calculator configured to calculate timing windows of first and second wires, which are routed in the semiconductor integrated circuit, under a first analysis condition and calculate timing windows of the first and second wires under a second analysis condition;
    a sequence determination module configured to determine whether a sequence of the timing windows of the first and second wires under the first analysis condition interchanges with a sequence of the timing windows of the first and second wires under the second analysis condition when there is no overlapping of the timing windows under any of the first and second analysis conditions; and
    an analysis module configured to analyze crosstalk occurring between the first and second wires when there is no overlapping of the timing windows under any of the first and second analysis conditions, the interchange of the sequence of the timing windows of the first and second wires occurs and when there is an overlapping of the timing windows of the first and second wires under at least one of the first and second analysis conditions, wherein the analysis module does not analyze the crosstalk when there is no overlapping of the timing windows under any of the first and second analysis conditions and the interchange of the sequence of the timing windows does not occur.

2. The system of claim 1, further comprising:
    a selection module configured to select a victim, from among a plurality of wires included in circuit information of the semiconductor integrated circuit, as the first wire, and
    an extraction module configured to extract an aggressor having a possibility of affecting the victim due to the crosstalk, from among the plurality of wires included in the circuit information, as the second wire.

3. The system of claim 2, wherein the analysis module calculates a difference in a delay time of a signal level of the victim between when a signal level of the victim and the aggressor changes at the same time and when a signal level of the victim and the aggressor does not change at the same time.

4. The system of claim 1, further comprising:
    a selection module configured to select a victim from among a plurality of wires included in circuit information of the semiconductor integrated circuit; and an extraction module configured to extract first and second aggressors having possibilities of affecting the victim due to the crosstalk, from among the plurality of wires included in the circuit information, as the first and second wires.

5. The system of claim 4, wherein the analysis module calculates a size of a pulse that occurs in the victim when the signal level of the first and second aggressors changes at the same time.

6. The system of claim 1, wherein the first and the second analysis conditions include a condition pertaining to at least one of an ambient temperature of the semiconductor integrated circuit, a power supply voltage of the semiconductor integrated circuit and a parameter of processes used for manufacturing the semiconductor integrated circuit.

* * * * *